United States Patent
Yoshikawa (10) Patent No.: US 8,934,245 B2
(45) Date of Patent: Jan. 13, 2015

(54) HEAT CONVEYING STRUCTURE FOR ELECTRONIC DEVICE

(75) Inventor: Minoru Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 274 days.

(21) Appl. No.: 13/498,102

(22) PCT Filed: Aug. 12, 2010

(86) PCT No.: PCT/JP2010/063694
§ 371 (c)(1),
(2), (4) Date: Mar. 23, 2012

(87) PCT Pub. No.: WO2011/040129
PCT Pub. Date: Apr. 7, 2011

(65) Prior Publication Data
US 2012/0180993 A1 Jul. 19, 2012

(30) Foreign Application Priority Data
Sep. 29, 2009 (JP) .................. 2009-224082

(51) Int. Cl.
*H05K 7/20* (2006.01)
*H01L 23/427* (2006.01)
(Continued)

(52) U.S. Cl.
CPC .......... *H05K 7/20809* (2013.01); *H01L 23/427* (2013.01); *H01L 23/473* (2013.01)
USPC .......... 361/700; 361/727; 361/702; 165/80.4; 165/104.33

(58) Field of Classification Search
CPC ............ H05K 7/2029; H05K 7/20309; H05K 7/20663–7/20681; H05K 7/208–7/20818; H01L 23/427; H01L 23/473
USPC ....................... 361/679.46–679.54, 688–727; 165/80.1–80.5, 104.33, 185; 257/712–722, E23.088; 174/15.1–15.2, 174/16.1–16.3, 547–548
See application file for complete search history.

(56) References Cited

U.S. PATENT DOCUMENTS 6,796,372 B2 * 9/2004 Bear ....................... 165/104.21
6,836,407 B2 * 12/2004 Faneuf et al. ............ 361/679.49

(Continued)

FOREIGN PATENT DOCUMENTS

CN 1801483 A 7/2006
CN 101026946 A 8/2007

(Continued)

OTHER PUBLICATIONS

Search Report and Chinese Office Action dated Mar. 26, 2014, with Japanese and English translation.

(Continued)

*Primary Examiner* — Zachary M Pape
(74) *Attorney, Agent, or Firm* — McGinn IP Law Group, PLLC (57) ABSTRACT

A heat conveying structure for an electronic device according to the present invention includes: an evaporating section that has a chamber structure with first fins erected therein, is thermally connected to the electronic device, evaporates a liquid coolant on the surfaces of the first fins to thereby change the liquid coolant to a vapor coolant, and sends out liquid coolant present near the first fins along with the vapor coolant as a gas-liquid two-phase flow coolant; a condensing section that has a chamber structure with second fins erected therein, is thermally connected to a radiator provided outside the electronic device, and changes the gas-liquid two-phase flow coolant in contact with the second fins to a liquid coolant; a vapor pipe that connects the evaporating section and the condensing section, and moves the gas-liquid two-phase flow coolant sent out from the evaporating section to the condensing section; and a liquid pipe that connects the evaporating section and the condensing section, and moves the liquid coolant from the condensing section to the evaporating section.

7 Claims, 9 Drawing Sheets

(51) Int. Cl.
*H01L 23/24* (2006.01)
*H01L 23/473* (2006.01)

(56) References Cited

U.S. PATENT DOCUMENTS

| | | | |
|---|---|---|---|
| 6,880,626 B2* | 4/2005 | Lindemuth et al. | 165/104.26 |
| 7,539,020 B2* | 5/2009 | Chow et al. | 361/726 |
| 8,164,901 B2* | 4/2012 | Neudorfer | 361/699 |
| 8,218,311 B2* | 7/2012 | Matsumura | 361/679.47 |
| 2003/0057546 A1 | 3/2003 | Memory et al. | |
| 2005/0063158 A1* | 3/2005 | Thiele et al. | 361/700 |
| 2005/0068728 A1* | 3/2005 | Chu et al. | 361/690 |
| 2006/0187639 A1* | 8/2006 | Carswell | 361/699 |
| 2007/0064397 A1 | 3/2007 | Chiba et al. | |
| 2007/0242438 A1* | 10/2007 | Belits et al. | 361/700 |
| 2007/0291452 A1* | 12/2007 | Gilliland et al. | 361/699 |
| 2008/0024990 A1* | 1/2008 | Peng et al. | 361/700 |
| 2009/0084525 A1 | 4/2009 | Satou et al. | |
| 2009/0154104 A1 | 6/2009 | Kondo et al. | |

FOREIGN PATENT DOCUMENTS

| | | |
|---|---|---|
| CN | 101472450 A | 7/2009 |
| JP | 4-67399 | 6/1992 |
| JP | 2003-179375 A | 6/2003 |
| JP | 2003-318342 A | 11/2003 |
| JP | 2007-088282 A | 4/2007 |
| JP | 2007-208155 A | 8/2007 |
| JP | 2009-088125 A | 4/2009 |
| JP | 2009-147156 A | 7/2009 |
| WO | WO2005/013657 A1 | 2/2005 |

OTHER PUBLICATIONS

International Search Report in PCT/JP2010/063694 dated Sep. 7, 2010 (English Translation Thereof).

* cited by examiner

HEAT CONVEYING STRUCTURE FOR ELECTRONIC DEVICE

TECHNICAL FIELD

The present invention relates to a heat conveying structure for an electronic device for conveying heat generated from an LSI or IC used for the electronic device to the outside of the electronic device for cooling, when a plurality of electronic devices are mounted on a rack and used.

BACKGROUND ART

Recently, electronic devices such as a computer and a network device use a plurality of devices to improve the processing capacity thereof. A method of operating the plurality of devices in parallel to perform distributed information processing or distributed arithmetic operation is mainstream. Since there is a limitation in floor area for installing the electronic device, a method of mounting a plurality of electronic devices on some racks collectively has been adopted. In order to mount as many as possible electronic devices on the rack, the height of each electronic device needs to be lowered. Consequently, a tall heat sink cannot be mounted immediately above the LSI or IC. Therefore a method is adopted where heat is transferred to a place away from the LSI or IC by using a heat pipe or the like, to dissipate heat to the atmosphere by a fin or the like provided in a condensing section at the end of the heat pipe at the destination.

However, when the electronic device represented by a 1 U server or a blade server is a low type device having a height of about 40 mm or less, an area ratio of a hoard for connecting between respective devices, referred to as a backplane and a middle plane for performing signal transmission or power feeding, which is provided in a direction of wind of the device, becomes relatively large. Therefore, an opening for sending cool wind into the device, a so-called air hole, is only minimally provided in the electronic device. Consequently, wind is forcibly fed by a fan having high static pressure in order to circulate wind to a small opening, and hence the driving power and noise of the fan increases more than necessary.

Therefore, a method of conveying heat to the outside of the electronic device and intensively cooling a radiator provided at the destination has been devised. In FIG. 8 of Patent Document 1, although not a device unit, there is disclosed a structure for conveying heat generated by each card to a condensing section provided above the card, and connecting to a cold water pipe arranged beforehand in a casing to dissipate the heat. In FIG. 4 of Patent Document 2, there is disclosed a structure that uses a heat pipe and is capable of connecting and disconnecting between a condensing section thereof and a heat sink serving as a radiator.

PRIOR ART DOCUMENTS

Patent Documents

[Patent Document 1] Japanese Unexamined Patent Application, First Publication No. 2003-179375
[Patent Document 2] Japanese Unexamined Patent Application, First Publication No. 2007-088282

SUMMARY OF THE INVENTION

Problem to be Solved by the Invention

However, in the heat conveying structure for an electronic device disclosed in these Patent Documents, there are problems in cooling an LSI or IC having a large amount of heat generation.

A first problem is that in heat transfer using only vapor as in the heat pipe, the amount of heat transfer is limited. A heat pipe has an equivalent thermal conductivity of two to three times that of a metal. However, vapor has a very small latent heat per unit volume as compared to liquid. Therefore, in the heat pipe, when the amount of heat generation becomes large, the working fluid dries up in the evaporating section, to cause a so-called dryout phenomenon, and the amount of heat generation that can be transferred decreases.

A second problem is that the thermal resistance deteriorates in a pipe-shaped condensing section. The thermal resistance in heat transfer can be described as in the following equation.

Thermal resistance=1/(evaporative heat transfer coefficient×area of evaporating section)+1/(condensing heat transfer coefficient×area of condensing section)

The areas of the pipe-shaped evaporating section and the pipe-shaped condensing section are calculated by $\pi \times$ inner diameter of pipe×contact length of evaporating section or boiling section. Consequently, when heat transfer is performed by a pipe, in order to reduce thermal resistance, the diameter of the pipe needs to be increased, or the number of pipes needs to be increased to increase the contact length. As a result, the occupied volume of the pipe with respect to packaging of a low electronic device increases, and hence, packaging density is not increased.

Moreover, the predominant proportion occupied by the thermal resistance of the pipe itself for conveying heat means that as a result, it is difficult to cool an LSI or IC having a large amount of heat generation. Furthermore, it is found by research performed by the present inventors that when the working fluid is other than water, for example, hydrofluoroether, the condensing heat transfer value deteriorates as compared to the evaporative heat transfer value, by one digit. The amount of heat that can be transferred by the heat conveying structure disclosed in these Patent Documents, in which the area of the condensing section is small, is substantially decreased.

It is an object of the present invention to provide a heat conveying structure for an electronic device in which large heat generation by an LSI or IC in an electronic device is transferred to a radiator outside the electronic device by using a heat transfer cycle including evaporation and condensation, without using a specific driving source such as a pump.

It is another object of the present invention to provide a heat conveying structure for an electronic device in which a condensing section connected to an LSI or IC is thermally connected to a radiator provided outside of the device so as to be separable therefrom, thereby facilitating expansion and maintenance/replacement of the device.

Means for Solving the Problem

To solve the above problems, a heat conveying structure for an electronic device according to the present invention includes: an evaporating section that has a chamber structure with first fins erected therein, is thermally connected to the electronic device, evaporates a liquid coolant on the surfaces of the first fins to thereby change the liquid coolant to a vapor coolant, and sends out liquid coolant present near the first fins along with the vapor coolant as a gas-liquid two-phase flow coolant; a condensing section that has a chamber structure with second fins erected therein, is thermally connected to a radiator provided outside the electronic device, and changes the gas-liquid two-phase flow coolant in contact with the second fins to a liquid coolant; a vapor pipe that connects the evaporating section and the condensing section, and moves the gas-liquid two-phase flow coolant sent out from the evaporating section to the condensing section; and a liquid pipe that connects the evaporating section and the condensing section, and moves the liquid coolant from the condensing section to the evaporating section.

It is preferable that the condensing section is connected to the radiator via a heat transfer member by a screw mechanism or a spring mechanism, and the condensing section is detachable from the radiator.

It is preferable that the first and second fins are plate fins with a gap between the fins being in a range of from 1 mm to 2 mm inclusive.

It is preferable that in the chamber, a vapor port is provided in a direction opposite to a gravity direction, and a liquid port is provided at a position opposite to the vapor port with the first or second fins therebetween.

It is preferable that the condensing section is pulled out to outside of the electronic device, and is connected to the radiator via a heat transfer member by a screw mechanism or a spring mechanism.

It is preferable that the electronic device is mounted on a rack, a cold water pipe causing cold water to flow into and flow out from the rack is provided, a jacket that performs cooling by circulating the cold water, and the cold water pipe are connected by a tube, and the condensing section is connected to the jacket for each electronic device.

It is preferable that the heat conveying structure for an electronic device is provided between the electronic device and a cooler provided outside of the electronic device.

It is preferable that the electronic device is mounted on a rack, and the heat conveying structure for an electronic device is provided between the electronic device and a cooler provided outside of the electronic device, and the condensing section is thermally connected to the cooler provided outside the rack.

Effect of the Invention

According to the heat conveying structure for an electronic device of the present invention, for example, even when an LSI or IC having a large amount of heat generation is mounted on a low electronic device, heat can be transferred to a radiator provided outside the device and cooled. Consequently, a fan or the like need not be rotated more than necessary, and driving power and noise of the fan can be reduced. This is because the evaporating section and the condensing section have the chamber structure with fins erected therein, to cause gas-liquid two-phase flow, thereby increasing the heat transfer amount, and the thermal resistance is reduced due to an increase in the area of the condensing section.

Moreover, according to the heat conveying structure for an electronic device of the present invention, maintenance and replacement of the electronic device can be facilitated. This is because, by having a structure where a large radiator is not provided on condensing section connected to the LSI or IC, it is thermally connected to the radiator outside of the electronic device, and the condensing section and the radiator can be separated, a large radiator need not pass through a small opening on the electronic device side.

EMBODIMENTS FOR CARRYING OUT THE INVENTION

Hereunder, a heat conveying structure for an electronic device according to some exemplary embodiments of the present invention will be explained. These exemplary embodiments are for specifically explaining for better understanding of the purport of the present invention, and the present invention is not limited thereto unless particularly specified. Moreover, figures used in the explanation below may indicate a relevant part in an enlarged scale for convenience sake for better understanding of features of the exemplary embodiments of the present invention, and dimensions and scale of respective components may not be the same as actual dimensions and scale.

(First Exemplary Embodiment)

Figure 1:
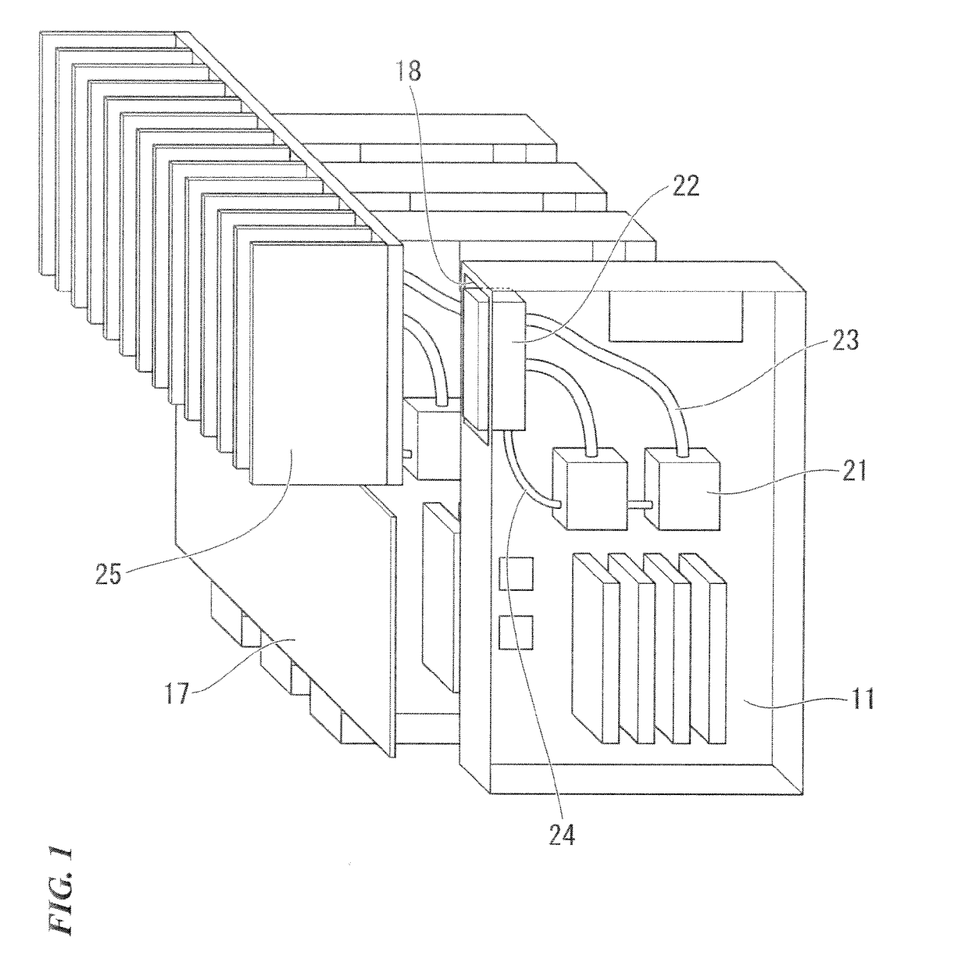
FIG. 1 is a schematic view of one example of a blade card mounted with a heat conveying structure for an electronic device, according to a first exemplary embodiment of the present invention.

FIG. 1 is a schematic view of one example of a blade card mounted with a heat conveying structure for an electronic device, according to a first exemplary embodiment of the present invention.

Functions of the electronic device are combined on one card 11. A plurality of cards 11 are connected to a backplane 17 via a connector or the like. An LSI or IC having a large amount of heat generation such as a CPU is mounted on the card 11. An evaporating section 21 is mounted directly above the LSI. A condensing section 22 is mounted in an opening section 18, which is an empty area, which is not connected to the backplane 17 of the card 11, and is thermally connected to a radiation part 25. The radiation part 25 is thermally connected to the plurality of cards 11 and is intensively cooled by a fan mounted on a rack.

Figure 2:
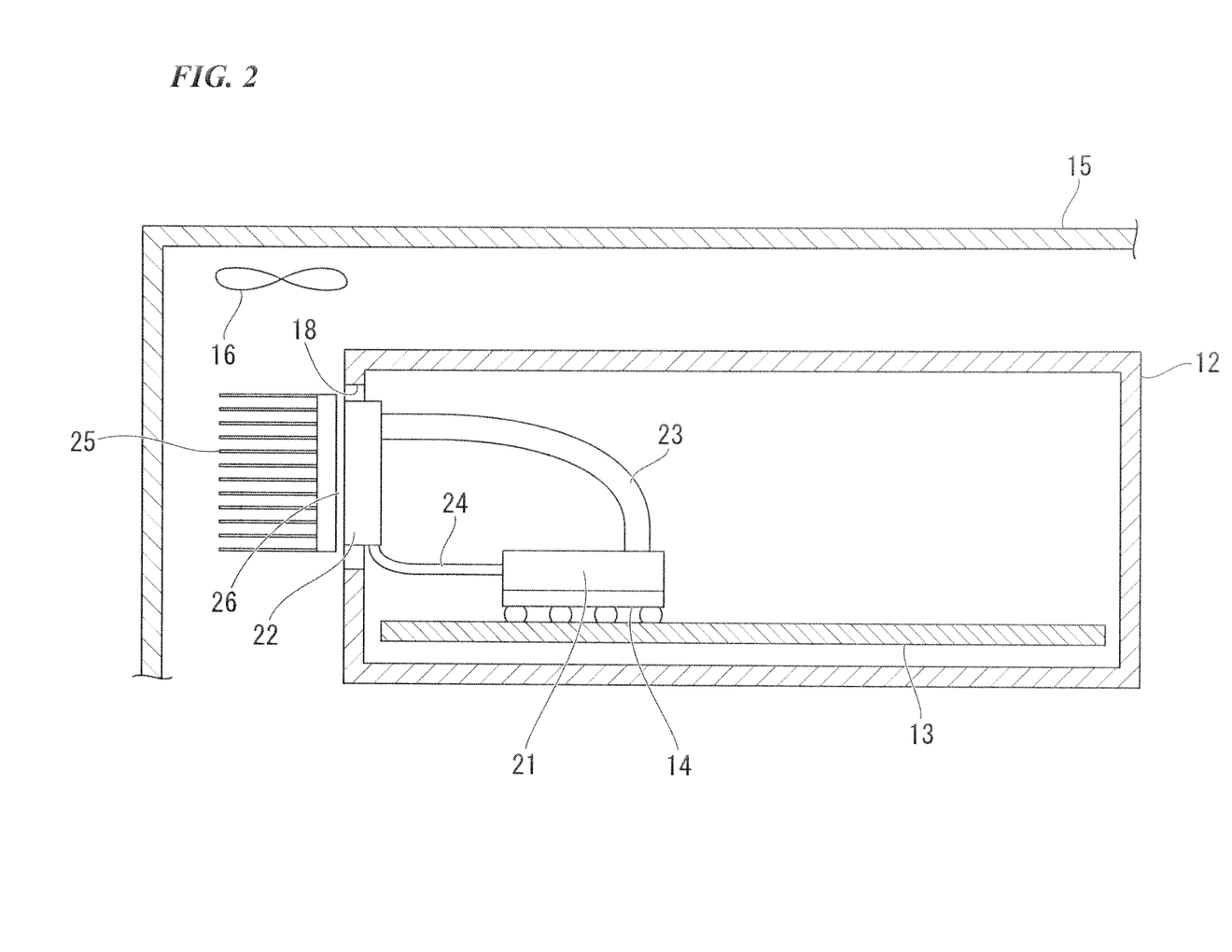
FIG. 2 is a cross-sectional view showing the heat conveying structure for an electronic device according to the first exemplary embodiment of the present invention.

FIG. 2 shows a cross-sectional view of the heat conveying structure for an electronic device. A plurality of electronic devices 12 mounted with an LSI 14 having a large amount of heat generation on a board 13 are collectively mounted on a rack 15. The evaporating section 21 is provided directly above the LSI 14. The evaporating section 21 is connected to the LSI 14 via a heat conducting member such as silicone grease or a radiation sheet. The condensing section 22 is fixed to the chassis opening section 18 of the electronic device 12. The condensing section 22 is thermally connected to the radiation part 25 via a heat conducting member 26 such as silicone grease or a radiation sheet by a screw or spring mechanism. The evaporating section 21 and the condensing section 22 each include a chamber structure shown in FIG. 3. A base 205 of the evaporating section 21 is thermally connected to the LSI 14. A base 205 of the condensing section 22 is thermally connected to the radiation part 25.

Figure 3:
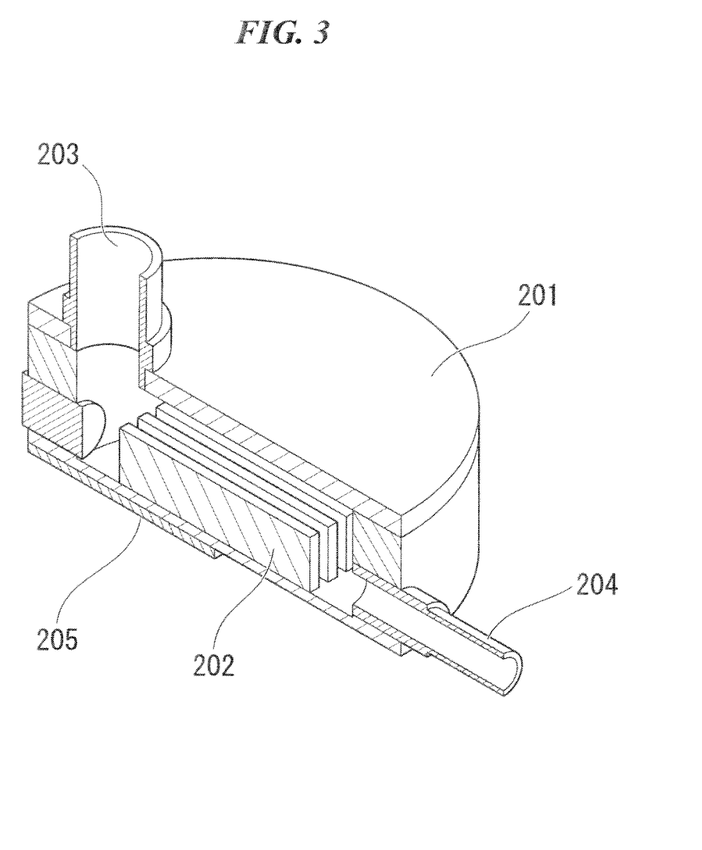
FIG. 3 is a cross-sectional view of a chamber structure of an evaporating section and a condensing section of the heat conveying structure for an electronic device shown in FIG. 2.

Fins 202 (first fins and second fins) are erected on the base 205. The base 205 and the fins 202 have an integral structure, and are made of metal such as copper or aluminum having high heat conductivity. The fins 202 of the evaporating section 21 are plate fins, and it is preferable that a gap between the fins is set to about 1 mm to 2 mm so that a coolant becomes vapor-liquid two-phase flow of vapor and liquid. In the condensing section 22, if the gap between the fins is too narrow, vapor does not go into between the fins, and if it is too wide, the area of the fin decreases. Consequently, also in the condensing section 22, the fins 202 are plate fins, and it is preferable that the gap between the fins is set to about 1 mm to 2 mm as in the evaporating section 21. According to such a configuration, thermal resistance can be decreased most in the condensing section. The base 205 and the chamber 201 can be fixed by a screw via a seal material such as an O-ring or can be stuck together or bonded by brazing. However, because they are used in a state in which pressure therein is reduced to create a vacuum, a bonding method that does not cause leakage in the pressure difference therebetween is desired.

In the chamber, a vapor port 203 is provided in a direction opposite to the gravity direction (that is, the upper side in the vertical direction). In the chamber, a liquid port 204 is provided at a position opposite to the vapor port 203 with the fins 202 therebetween. A vapor pipe 23 is connected to the vapor port 203. A liquid pipe 24 is connected to the liquid port 204. As a material of the vapor pipe 23 and the liquid pipe 24, a stable material through which the coolant therein does not penetrate and which does not cause chemical reaction with the coolant therein, for example, a metal or resin material such as plastic having such stiffness that the pipe is not broken due to decompression is selected. Because volume-expanded vapor flows in the vapor pipe 23, the flow rate of the coolant in the vapor pipe 23 is larger than that in the liquid pipe 24. Accordingly, in the vapor pipe 23, pipe friction or pressure loss at the time of flow-in of the coolant from the chamber to the pipe and flow-out of the coolant from the pipe to the chamber increases. The pressure loss increases the saturated vapor pressure of the system, and raises the boiling point of the coolant to increase the thermal resistance. Consequently, it is preferable that the internal diameter of the vapor pipe 23 is two to three times larger than the internal diameter of the liquid pipe 24.

The radiation member 25 is a heat sink in which radiation fins or the like are erected. The radiation member 25 is held in the rack 15, and provided outside of the electronic device 12. A fan 16 for cooling the radiation member 25 is mounted on the rack 15. The radiating area of the radiation member 25 can be increased as compared to a case in which the radiation member 25 is mounted inside of the electronic device 12. Therefore the wind speed at the time of passing through the radiation member 25 can be decreased by that much. That is to say, the rotational speed of the fan 16 can be reduced as compared to a case in which the radiator is mounted inside of the electronic device 12, thereby enabling to reduce the driving power and noise of the fan.

Next the overall operation of the present exemplary embodiment will be explained in detail with reference to FIG. 4 and FIG. 5.

Figure 4:
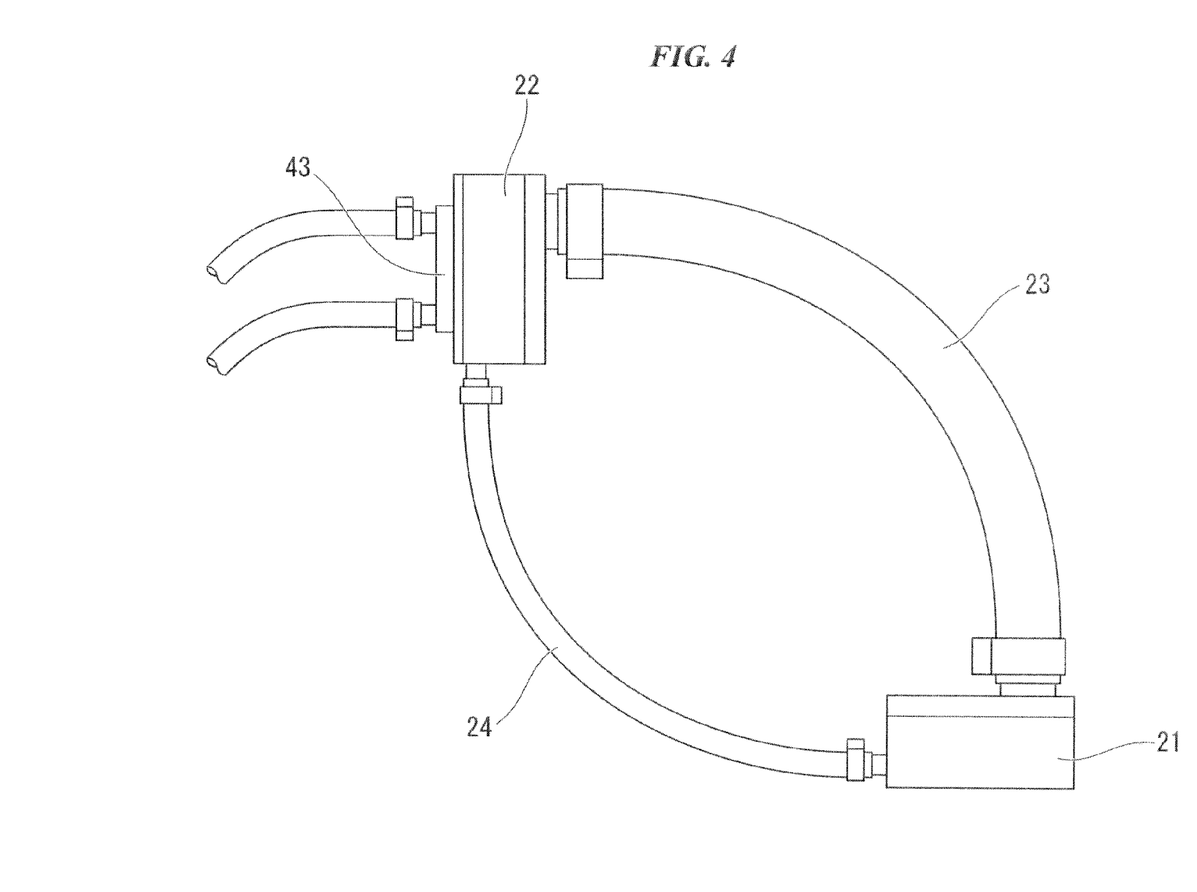
FIG. 4 is an overall view of the heat conveying structure for an electronic device shown in FIG. 2.
Figure 5:
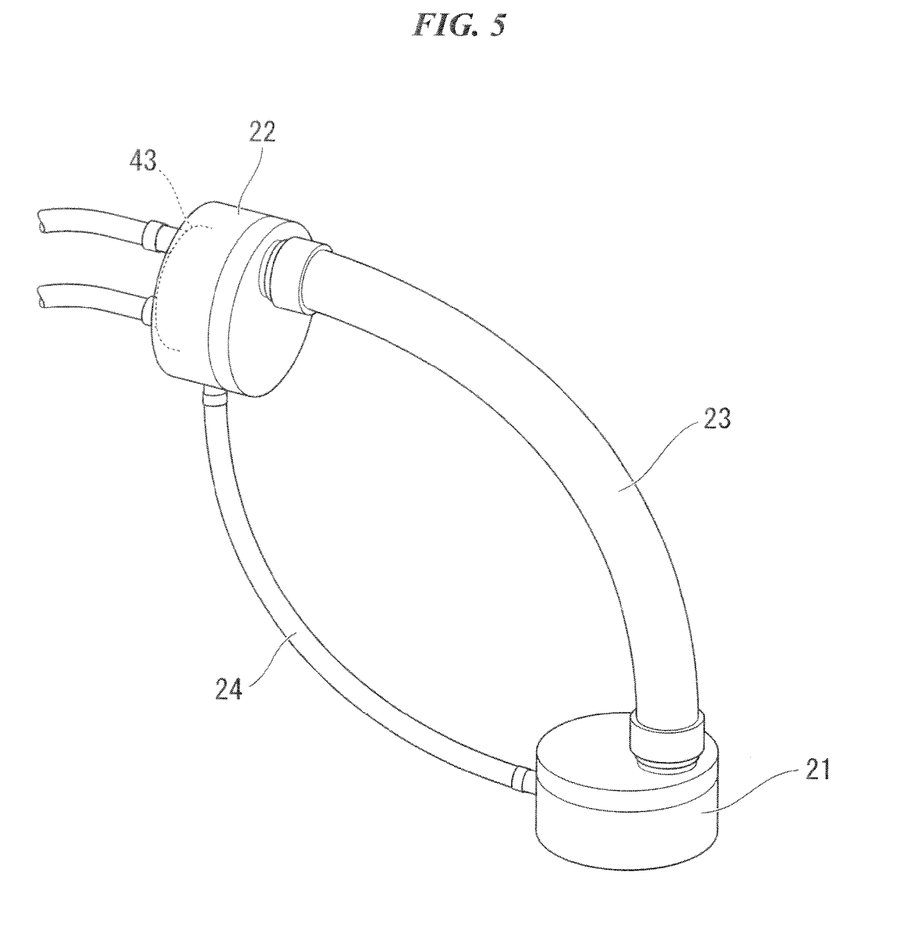
FIG. 5 is a perspective view of the heat conveying structure for an electronic device shown in FIG. 2.

FIG. 4 shows a heat conveying structure for an electronic device according to the first exemplary embodiment. FIG. 5 is a perspective view of FIG. 4.

A coolant having a low boiling point is filled into a system in which the evaporating section 21 and the condensing section 22 are respectively connected by the vapor pipe 23 and the liquid pipe 24. As the coolant, for example, an insulating inert coolant such as fluorocarbon or hydrofluoroether is selected. In order to realize a state in which the boiling point, that is, the saturated vapor pressure of the coolant is lowered, after the coolant is filled therein, the system is sealed in a state with the pressure being reduced to create a vacuum. Consequently, the boiling point of the coolant becomes less than for a normal temperature environment, and when the LSI or IC thermally connected to the evaporating section 21 generate heat, the coolant on the surfaces of the fins 202 provided therein immediately exceeds the boiling point and the phase thereof changes from liquid to vapor. At this time, as the energy for changing the coolant from liquid to vapor, the heat generation by the LSI is used as latent heat.

When the liquid becomes vapor bubbles and expands in volume, it moves up by buoyancy in the direction opposite to the gravity direction. At that time, if the gap between the fins is set to be from 1 mm to 2 mm, the bubbles engulf the coolant still in a liquid state in the vicinity thereof and move up together, and move through the vapor pipe 23 in a state of vapor-liquid two-phase flow of vapor and liquid toward the condensing section 22 having a low temperature, that is, a low pressure. By making the coolant to be the vapor-liquid two-phase flow, latent heat per unit volume increases as compared to a case of only vapor, and a heat quantity having a large amount of heat generation can be transferred to the condensing section.

A base surface of the condensing section 22 is thermally connected to the radiation member and cooled. Therefore, the coolant moving into the condensing section 22 in the vapor-liquid two-phase flow comes in contact with the fins 202 in the condensing section, and the vapor is cooled, condensed, and liquefied. By positioning the mounting position of the condensing section 22 above the mounting position of the evaporating section 21 in the gravity direction, the coolant which has become liquid passes through the liquid pipe 24 and flows back by the gravity. However, when a coolant having a large surface tension such as water is used, by applying to the inside of the liquid pipe 24, a microstructure referred to as a wick that causes a capillary action, the mounting positions of the evaporating section 21 and the condensing section 22 need not be specified.

That is to say, the heat conveying structure (heat transfer device) for the electronic device 12 according to the first exemplary embodiment of the present invention includes the evaporating section 21, the condensing section 22, the vapor pipe 23, and the liquid pipe 24.

The evaporating section 21 has a chamber structure with fins 202 erected therein, is thermally connected to the electronic device 12, evaporates a liquid coolant on the surfaces of the first fins 202 to thereby change it to a vapor coolant, and sends out the liquid coolant present near the fins 202 along with the vapor coolant as a gas-liquid two-phase flow coolant.

The condensing section 22 has a chamber structure with fins 202 erected therein, is thermally connected to the radiation part 25 provided outside of the electronic device 12, and changes the gas-liquid two-phase flow coolant in contact with the fins 202 to a liquid coolant.

The vapor pipe 23 connects the evaporating section 23 and the condensing section 22, and moves the gas-liquid two-phase flow coolant sent out from the evaporating section 23 to the condensing section 22.

The liquid pipe 24 connects the evaporating section 23 and the condensing section 22, and moves the liquid coolant from the condensing section 2 to the evaporating section 23.

Operation and effect of the present exemplary embodiment will be explained next.

In the present exemplary embodiment, even when the amount of heat generation of the LSI or IC is large, heat transfer can be performed by mounting the evaporating section 21, without mounting a large radiator such as a heat sink immediately above the LSI or IC. Therefore the foot print occupied by the cooling parts can be decreased. Accordingly, a wiring length, for example, between a CPU and a memory can be shortened, thereby enabling high-speed operation of a computer.

Moreover, in the present exemplary embodiment, latent heat that can obtain a larger heat transfer than by circulating liquid is used, without using an external driving source such as a pump. In addition, the radiation part 25 with expanded radiating area is installed outside the electronic device. Consequently, the driving power itself of the fan can be reduced, and the cooling power required for cooling the electronic device can be reduced.

(Second Exemplary Embodiment)

Figure 6:
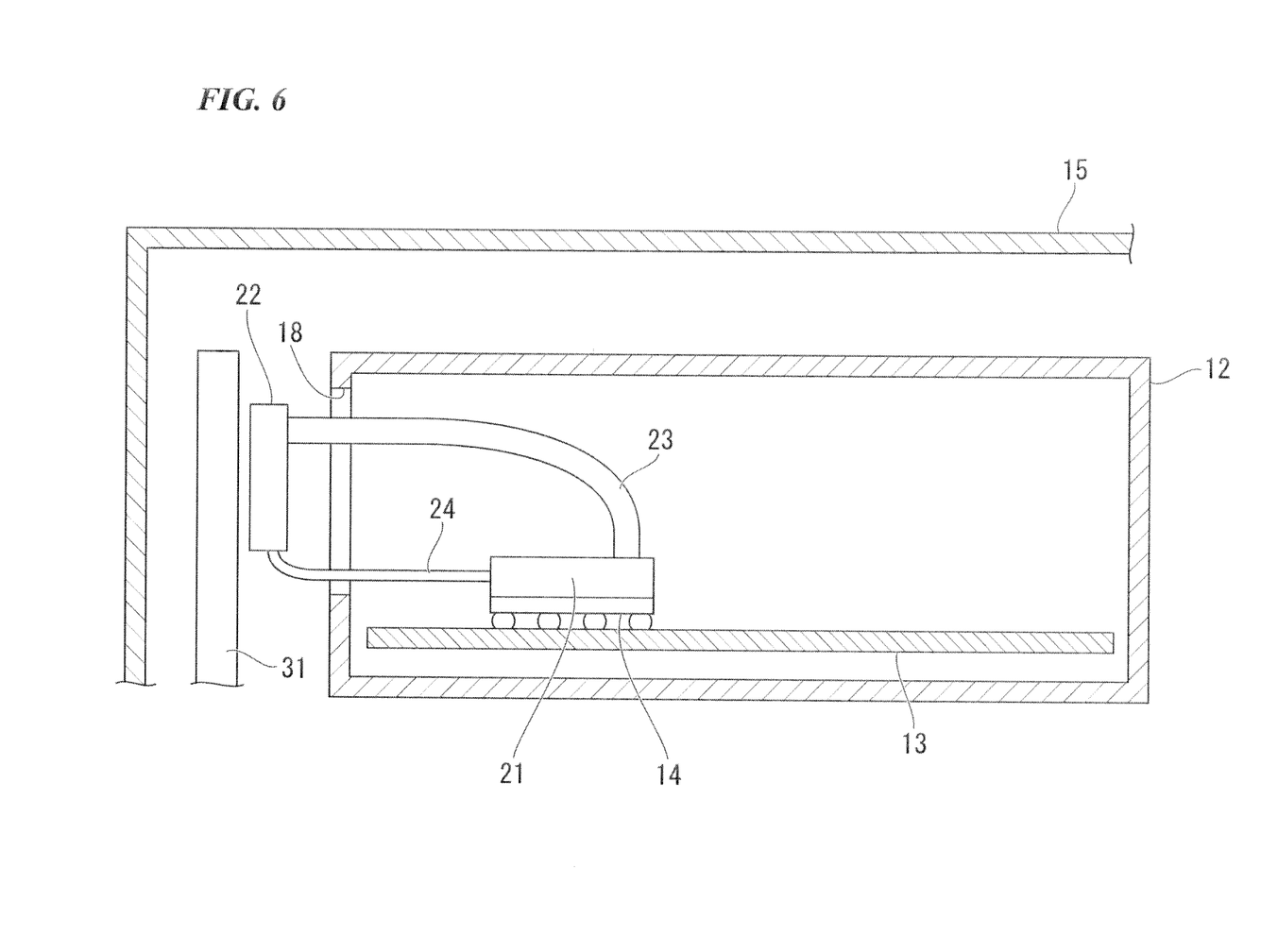
FIG. 6 is a cross-sectional view showing a heat conveying structure for an electronic device according to a second exemplary embodiment.

A second exemplary embodiment of the present invention is shown in FIG. 6.

A condensing section 22 is thermally connected to a radiator 31 such as a cold plate provided inside of a rack 15, in a state where it is pulled out from an opening section 18 provided in an electronic device 12. The radiator 31 such as a cold plate may liquid cool the condensing section by, for example, providing flow channels therein and flowing liquid such as water in flow channels, or it may air cool the condensing section 22 by a heat sink provided with radiation fins.

As in the second exemplary embodiment, by providing the condensing section 22 outside of the opening section 18, cold wind can flow into the opening section 18, and for example, a chip set other than a CPU of the electronic device can be cooled. At this time, because the CPU having a large amount of heat generation is separately cooled by the radiator 31 such as the cold plate, driving power of a fan required for cooling inside of the electronic device 12 can be reduced.

(Third Exemplary Embodiment)

Figure 7:
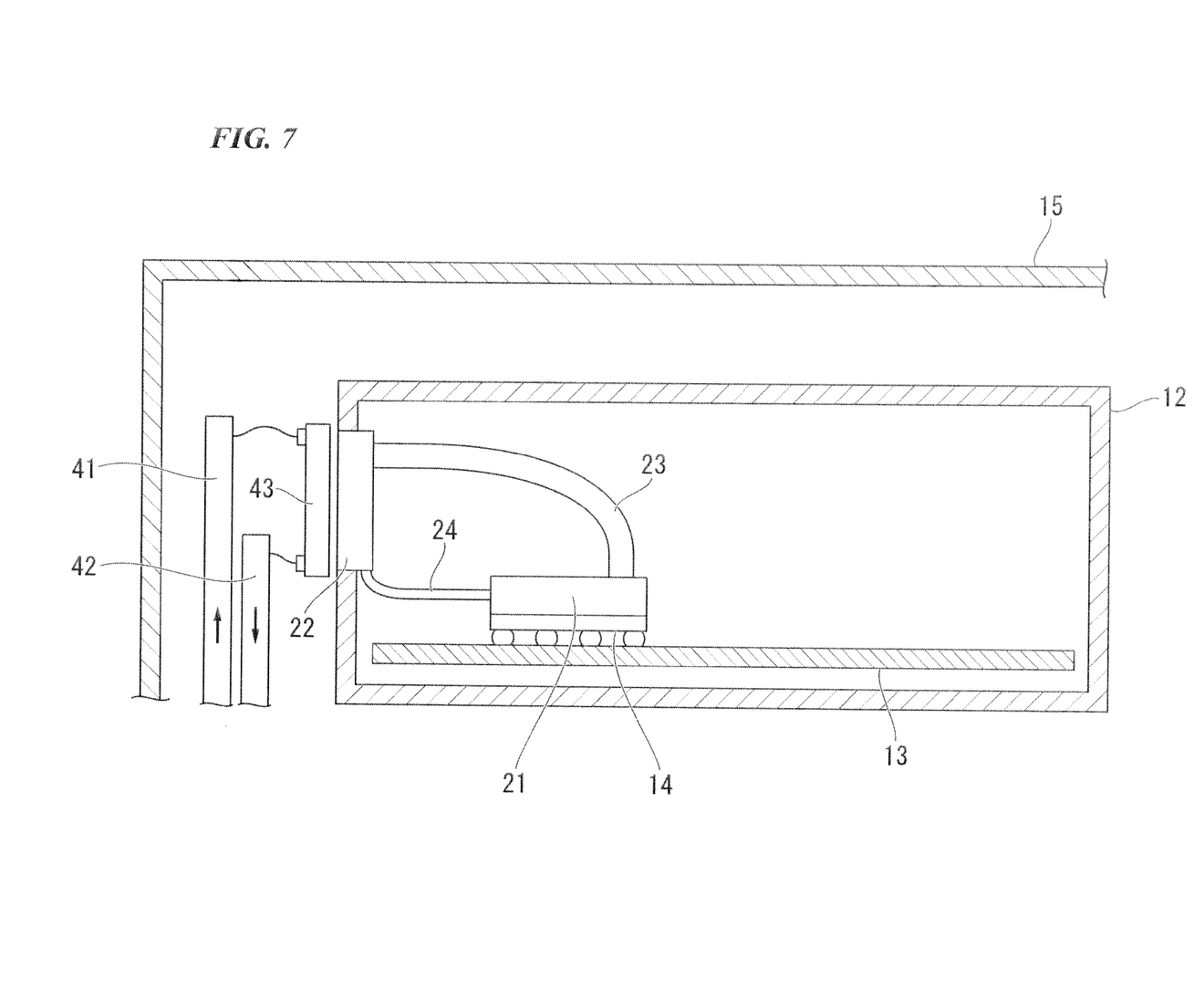
FIG. 7 is a cross-sectional view showing a heat conveying structure for an electronic device according to a third exemplary embodiment.

A third exemplary embodiment of the present invention is shown in FIG. 7.

An in-side cold water pipe 41 through which cooling water flows into a rack, and an out-side cold water pipe 42 through which cooling water flows out, are provided in a rack 15. A water cooling jacket 43 with flow channels is individually connected to the respective cold ater pipes 41 and 42 by a tube or the like. The water cooling jackets 43 are respectively connected to condensing sections 22 of a plurality of electronic devices 12.

As in the third exemplary embodiment, by thermally connecting the water cooling jacket 43 to the condensing section 22 one-to-one, it is not required to prepare a radiator in the rack 15 matched with the specification of the electronic device 12 at the time of expansion or maintenance/replacement of the electronic device 12, thereby enabling to simplify the operation.

(Fourth Exemplary Embodiment)

Figure 8:
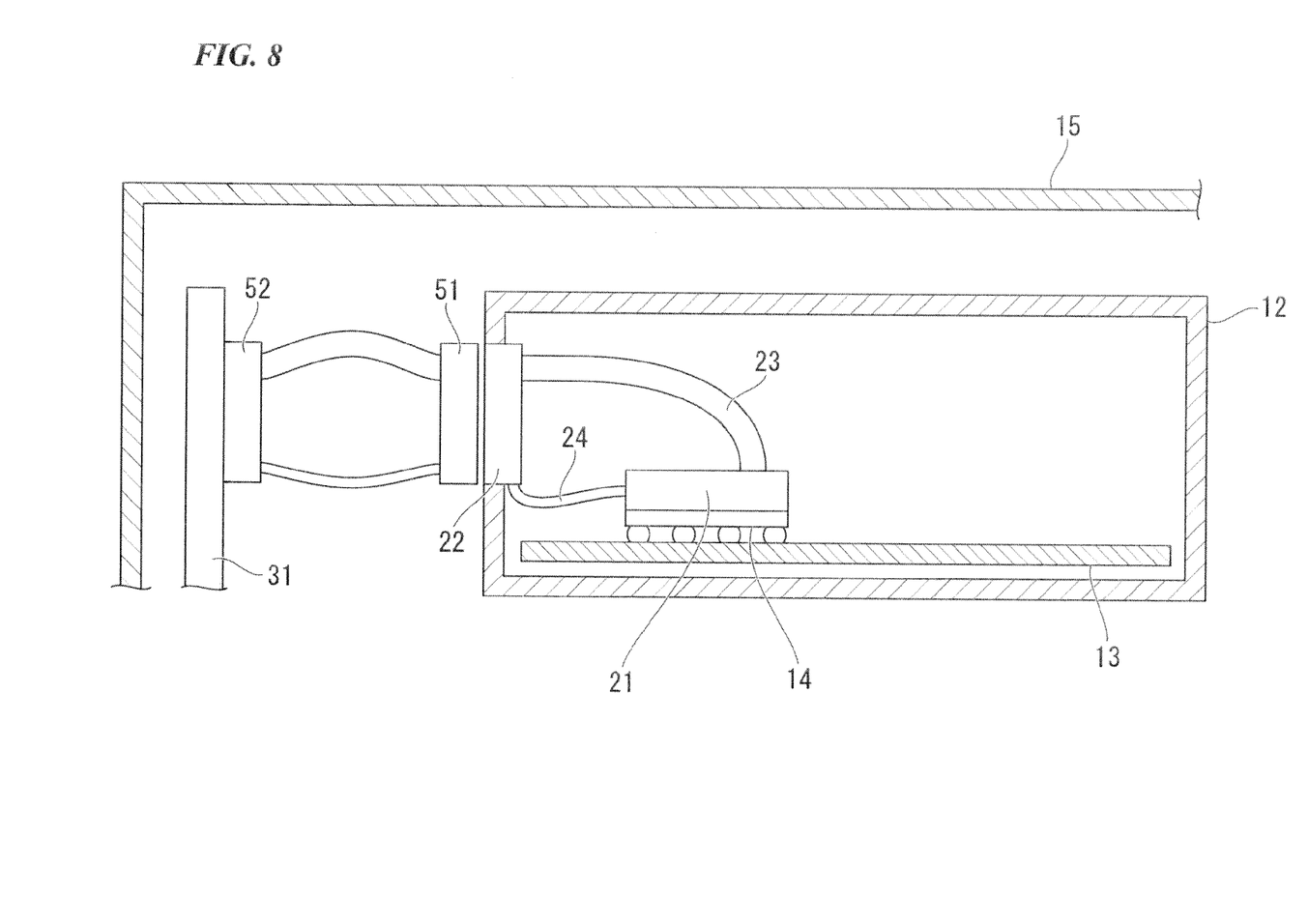
FIG. 8 is a cross-sectional view showing a heat conveying structure for an electronic device according to a fourth exemplary embodiment.

A fourth exemplary embodiment of the present invention is shown in FIG. 8.

A system of an evaporation-condensation heat transfer cycle including an outside evaporating section 51 and an outside condensing section 52 is constructed between an electronic device 12 and a radiator 31 such as a cold plate. In this case, a system of another evaporation-condensation heat transfer cycle may be provided in the electronic device 12, or heat may be transferred by another means in the electronic device 12. When there is a system of another evaporation-condensation cycle in the electronic device 12, an inside condensing section and an outside evaporating section are thermally connected, thereby forming a multiple-stage evaporation-condensation cycle. By implementing the system of the evaporation-condensation cycle outside of the electronic device 12, heat can be transferred even if a mounting distance between the electronic device 12 and the radiator 31 such as a cold plate is away from each other.

(Fifth Exemplary Embodiment)

Figure 9:
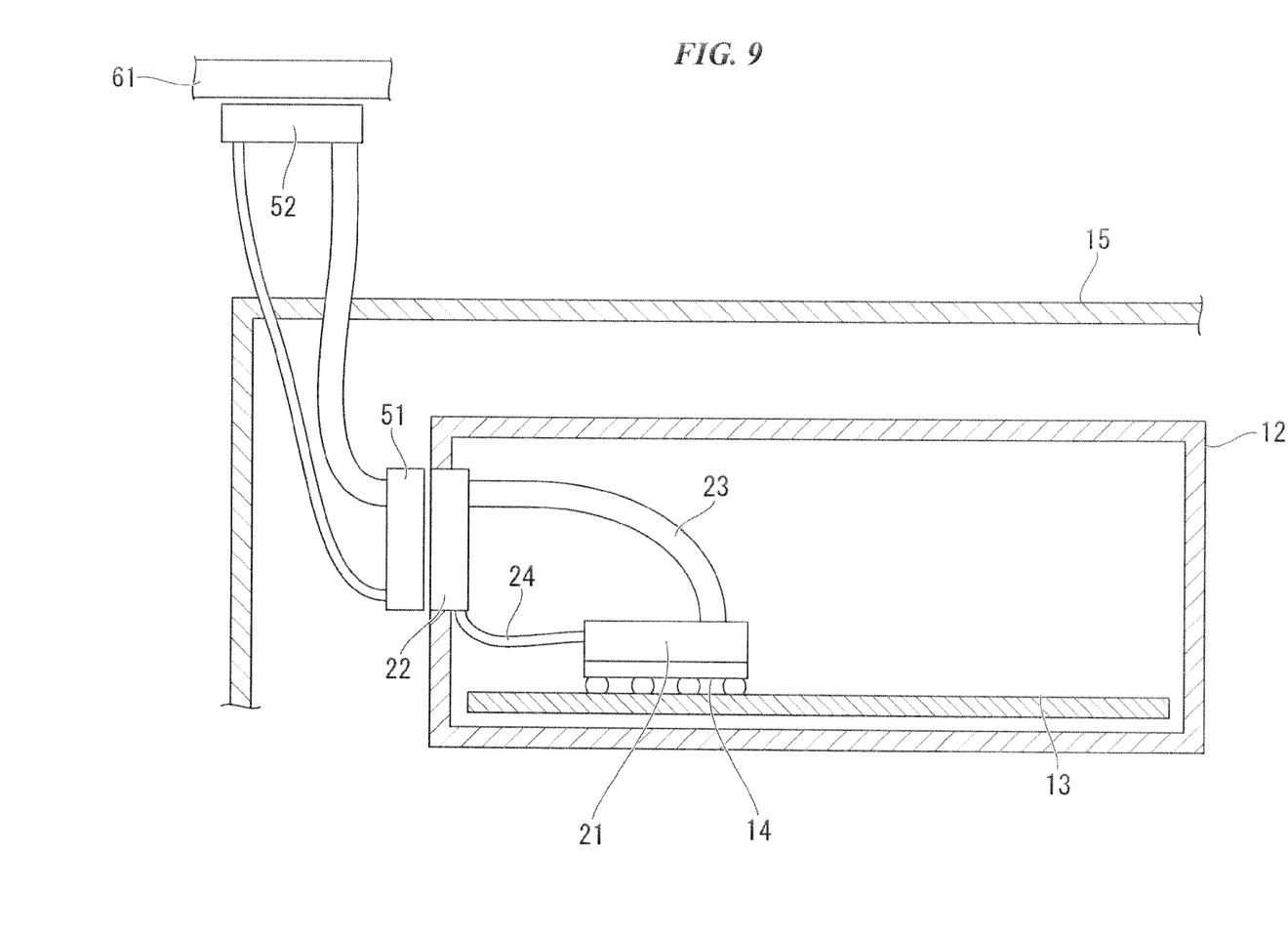
FIG. 9 is a cross-sectional view showing a heat conveying structure for an electronic device according to a fifth exemplary embodiment.

A fifth exemplary embodiment of the present invention is shown in FIG. 9.

An outside condensing section 52 of an outside evaporation-condensation heat transfer cycle is thermally connected to an outside cooler 61 provided outside of a rack 15, for example, air conditioning equipment of a room in which the rack is installed. By thermally and directly connecting the outside condensing section 52 and the cooler 61 outside of the rack, a fan in the rack 15 can be omitted or driving power can be reduced further.

The present invention has been explained with reference to the exemplary embodiments. However, the present invention is not limited to the above exemplary embodiments. The configuration and the details of the present invention can be variously changed by a person skilled in the art within the scope of the present invention.

This application is based upon and claims the benefit of priority from Japanese patent application No. 2009-224082, filed Sep. 29, 2009, the disclosure of which is incorporated herein in its entirety by reference.

INDUSTRIAL APPLICABILITY

According to the present invention, a computer or a network device mounted on a rack can be applied to a cooling structure for realizing high-density packaging without increasing an installation area. Moreover, because power required for cooling can be reduced, application to air-conditioning equipment in a server room or a data center is possible.

DESCRIPTION OF REFERENCE SYMBOLS

11 Card
12 Electronic device
13 Substrate
14 LSI
15 Rack
16 Fan
17 Backplane
18 Opening section
21 Evaporating section
22 Condensing section
23 Vapor pipe
24 Liquid pipe
25 Radiation part
26 Heat conducting member
31 Cold plate
41 In-side cold water pipe
42 Out-side cold water pipe
43 Water cooling jacket
51 Outside evaporating section
52 Outside condensing section
61 Outside cooler
201 Chamber

202 Fin
203 Vapor port
204 Liquid port
205 Base

The invention claimed is:

1. A heat conveying structure for an electronic device, the heat conveying structure comprising: an evaporating section that is provided inside the electronic device, the evaporating section having a chamber structure with first fins erected therein, the evaporating section being thermally connected to the electronic device, the evaporating section evaporating a liquid coolant on the surfaces of the first fins to thereby change the liquid coolant to a vapor coolant, and the evaporating section sending out liquid coolant present near the first fins along with the vapor coolant as a gas-liquid two-phase flow coolant; a condensing section that is provided outside the electronic device, the condensing section having a chamber structure with second fins erected therein, the condensing section being thermally connected to a radiator provided outside the electronic device, and the condensing section changing the gas-liquid two-phase flow coolant in contact with the second fins to a liquid coolant; a vapor pipe that connects the evaporating section and the condensing section, and moves the gas-liquid two-phase flow coolant sent out from the evaporating section to the condensing section; and a liquid pipe that connects the evaporating section and the condensing section, and moves the liquid coolant from the condensing section to the evaporating section, wherein the electronic device includes an opening section, and wherein the vapor pipe and the liquid pipe are connected to the evaporating section and the condensing section through the opening section.

2. The heat conveying structure for an electronic device according to claim 1, wherein the first and second fins comprise plate fins with a gap between the fins being in a range of from 1 mm to 2 mm inclusive.

3. The heat conveying structure for an electronic device according to claim 1, wherein in the chamber, a vapor port is provided in a direction opposite to a gravity direction, and a liquid port is provided at a position opposite to the vapor port with the first or second fins therebetween.

4. The heat conveying structure for the electronic device according to claim 1, wherein all of the condensing section is provided outside the electronic device.

5. The heat conveying structure for the electronic device according to claim 1,
wherein an entirety of the condensing section is provided outside the electronic device, and
wherein an entirety of the evaporating section is provided inside the electronic device.

6. The heat conveying structure for the electronic device according to claim 1, wherein the evaporating section is mounted directly above a central processing unit of the electronic device.

7. The heat conveying structure for the electronic device according to claim 1, wherein the electronic device includes an opening section, wherein an entirety of the condensing section is provided outside the electronic device.

* * * * *